(12) United States Patent
Bergin et al.

(10) Patent No.: US 10,937,211 B2
(45) Date of Patent: Mar. 2, 2021

(54) AUTOMATED PARAMETRIZATION OF FLOOR-PLAN SKETCHES FOR MULTI-OBJECTIVE BUILDING OPTIMIZATION TASKS

(71) Applicant: Autodesk, Inc., San Rafael, CA (US)

(72) Inventors: Michael S. Bergin, El Cerrito, CA (US); Mehdi Nourbakhsh, Richmond, CA (US); Mohammad Keshavarzi, Albany, CA (US); Chin-Yi Cheng, Walnut Creek, CA (US)

(73) Assignee: AUTODESK, INC., San Rafael, CA (US)

( * ) Notice: Subject to any disclaimer, the term of this patent is extended or adjusted under 35 U.S.C. 154(b) by 0 days.

(21) Appl. No.: 16/681,591

(22) Filed: Nov. 12, 2019

(65) Prior Publication Data

US 2020/0151923 A1    May 14, 2020

Related U.S. Application Data

(60) Provisional application No. 62/758,370, filed on Nov. 9, 2018.

(51) Int. Cl.
| | |
|---|---|
| *G06T 11/20* | (2006.01) |
| *G06T 11/60* | (2006.01) |
| *G06T 19/20* | (2011.01) |
| *G06K 9/32* | (2006.01) |
| *G06T 17/10* | (2006.01) |
| *G06F 30/13* | (2020.01) |
| *G06F 40/205* | (2020.01) |

(52) U.S. Cl.
CPC ............ *G06T 11/203* (2013.01); *G06F 30/13* (2020.01); *G06F 40/205* (2020.01); *G06K 9/325* (2013.01); *G06T 11/60* (2013.01); *G06T 17/10* (2013.01); *G06T 19/20* (2013.01); *G06T 2219/2024* (2013.01)

(58) Field of Classification Search
CPC ...................................................... G06T 11/203
USPC ........................................................ 345/619
See application file for complete search history.

(56) References Cited

U.S. PATENT DOCUMENTS

| | | | | |
|---|---|---|---|---|
| 2013/0262041 | A1* | 10/2013 | Fu ........................ | G06F 30/00 703/1 |
| 2014/0267717 | A1* | 9/2014 | Pitzer .................. | G01C 15/002 348/143 |

OTHER PUBLICATIONS

Funkhouser, T., et al., "A Search Engine for 3D Models", ACM Transactions on Graphics, Jan. 2003, pp. 83-105, vol. 22, No. 1.
Eitz, M., et al., "Sketch-Based Shape Retrieval", ACM Transactions on Graphics, Jul. 2012, pp. 1-10, vol. 31, No. 4.

(Continued)

*Primary Examiner* — Shivang I Patel
(74) *Attorney, Agent, or Firm* — Gates & Cooper LLP

(57) ABSTRACT

A method and system provide the ability to parametrize a sketch. A sketch is acquired and includes raster lines that define a raster image based floor-plan sketch. Vectorized geometry is generated from the sketch dynamically in real time based on raster lines. A parametric model that is optimizable is generated from the vectorized geometry. The parametric model is generated dynamically in real time, and the raster lines are represented in the parametric model as three-dimensional walls. The parametric model is displayed and edited. Upon editing a parameter of a three-dimensional wall, other parameters in the parametric model are autonomously updated.

18 Claims, 9 Drawing Sheets

(56) References Cited

OTHER PUBLICATIONS

Hou, S., et al., "Sketch-based 3D Engineering Part Class Browsing and Retrieval", EUROGRAPHICS Workshop on Sketch-Based Interfaces and Modeling, Jan. 2006, pp. 131-138.
Nishida, G., et al., "Interactive Sketching of Urban Procedural Models", ACM Transactions on Graphics, Jul. 2016, pp. 1-11, vol. 35, No. 4.
Schneider, R.G., et al., "Sketch Classification and Classification-driven Analysis using Fisher Vectors", Nov. 2014, pp. 1-9, ACM Transactions on Graphics, vol. 33, No. 6.
Su, H., et al., "Multi-view Convolutional Neural Networks for 3D Shape Recognition", 2015 IEEE International Conference on Computer Vision, pp. 945-953.
Wang, F., et al., "Sketch-based 3D Shape Retrieval using Convolutional Neural Networks", 2015 IEEE Conference on Computer Vision and Pattern Recognition (CVPR), 2015, pp. 1875-1883.

\* cited by examiner

AUTOMATED PARAMETRIZATION OF FLOOR-PLAN SKETCHES FOR MULTI-OBJECTIVE BUILDING OPTIMIZATION TASKS

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 62/758,370, filed on Nov. 9, 2018, with inventor(s) Michael S. Bergin, Mehdi Nourbakhsh, Mohammad Keshavarzi, and Chin-Yi Cheng, entitled "Automated Parametrization of Floor-Plan Sketches for Multi-Objective Building Optimization Tasks".

This application is related to the following co-pending and commonly-assigned patent application(s), which application(s) is/are incorporated by reference herein:

U.S. patent application Ser. No. 16/254,083, filed on Jan. 22, 2019, by Michael S. Bergin, Chin-Yi Cheng, and Mehdi Nourbakhsh, entitled "Building Information Design Synthesis (BIDS)", which application claims the benefit of U.S. Provisional Patent Application Ser. No. 62/619,555 filed on Jan. 19, 2018.

BACKGROUND OF THE INVENTION

1. Field of the Invention

The present invention relates generally to graphic design drawings, and in particular, to a method, system, apparatus, and article of manufacture for developing a fully parametric optimizable model based on a drawing sketch as input.

2. Description of the Related Art (Note: This application references a number of different publications as indicated throughout the specification by reference names and/or dates enclosed in brackets, e.g., [Smith 2001]. A list of these different publications can be found below in the section entitled "References." Each of these publications is incorporated by reference herein.)

In recent years, performance-based generative design systems (PGDS) have been widely adopted in the building design process, altering iterative trial-and-error cycles, to efficient optimization-based workflows. Using generative design systems, the user first programmatically describes the design constraints and then establishes desired building performance goals. This would allow the system to subsequently search for a solution that best matches the desired performance criteria in the feasible solution space. PDGS systems are mostly deployed in visual programming tools, where they can efficiently integrate with building performance simulation software and optimization algorithms. However, this process often requires a spectrum of technical expertise in the modeling and parametrization stages, excluding many designers from taking advantage of such an approach. Furthermore, modifying the parametric logic and constraints of generative models can be time-consuming tasks, limiting the ideal iterative process between the designer and the system.

One component of embodiments of the invention is the ability to convert a sketch-based rasterized input to a vectorized parametrized model. A common methodology that has been widely explored in previous studies is to use various matching strategies to compare the similarity of input sketches to an existing database of 2D or 3D models ([Eitz, Richter, et al. 2012]; [Funkhouser 2003], [Hou 2006], [Schneider 2014]). However, these systems only allow retrieval of existing 3D models and provide no means to create new 3D models. More recently, sketch-based shape retrieval has been demonstrated through convolutional neural networks (CNNs). CNNs are able to learn hierarchical image representations optimized for image processing performance. [Krizhevsky 2017] and [Sue 2015] performed sketch-based shape retrieval by adopting a CNN architecture pre-trained on images, then fine-tuning it on a dataset of sketches collected by human volunteers ([Eitz, Hays, and Alexa 2012]. [Wang 2015]) used a Siamese CNN architecture to learn a similarity metric to compare human and computer-generated line drawings. Nishida et al. introduced a CNN-based urban procedural model generation from sketches. [Nishida 2016] However, instead of solving directly for the final shape, their method suggests potentially incomplete parts that require further user input to produce the final shape. In contrast, embodiments of the invention are end-to-end, requiring users to provide only an approximate sketch of the floorplan layout.

In the field of performance-based generative design, previous research can be initially categorized based on the performance criteria itself. Works of [Asadi 2015] and [Attia 2013] provide a technical review of relevant research applying simulation-based optimization methods to sustainable building design, Nguyen et al. [Nguyen 2014] focus the discussion on discontinuous multi-modal building optimization problems, the performance, and selection of optimization algorithms for building performance. In terms of architectural design strategies, [Turrin 2011] discusses the benefits derived from combining parametric modeling and Genetic Algorithms (GAs) to achieve a performance-oriented process in design, with specific focus on architectural design, with a focus on the key role played by geometry in architecture. [Huang 2016] analyze the history, current status, and potential of optimal building design based on the simulation performance.

[Basbagill 2014] propose a multi-objective feedback approach for determining life-cycle environmental impact and cost performance of buildings at the conceptual design stage, exploring the concept of multidisciplinary design optimization. [Brown 2016] also presents a multidisciplinary optimization model for structural and energy performance at early stage design phases. In that work, the structural optimization objective was to minimize the amount of steel required, and the energy optimization objective was to reduce the annual energy of the building in terms of lighting, heating, and cooling. The Non-Dominated Sorting Genetic Algorithm II (NSGA-II) was used to iteratively approach the Pareto front over several generations of design alternatives of three types of long steel span structures [Lin 2014] focuses on early-stage design decisions, proposing a framework for concept design based on multiple design objectives, using a custom GA for design and performance optimization.

In view of the above, what is needed is the capability for a non-engineer user-designer to generate a fully parametric optimizable building model in an intuitive, efficient manner.

SUMMARY OF THE INVENTION

Developing fully parametric building models for performance-based generative design tasks often requires proficiency in many advanced 3D modeling and visual programming language platforms, limiting its use for many building designers. Moreover, iterations of such models can be time-consuming tasks and sometimes limiting, as major changes in the layout design may result in remodeling the entire parametric definition. To address this challenge, embodiments of the invention introduce a novel automated generative design system, which takes a basic floor plan sketch as an input and provides a fully parametric model prepared for multi-objective building optimization as output. While developed to target amateur users, the system converts undeveloped concept sketches of floor-plan layouts to vectorized parametric models. Furthermore, the user-designer can assign various design variables for its desired building elements by using simple annotations in the drawing. Embodiments of the invention recognize the corresponding element and define variable constraints to prepare for a multi-objective optimization problem.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
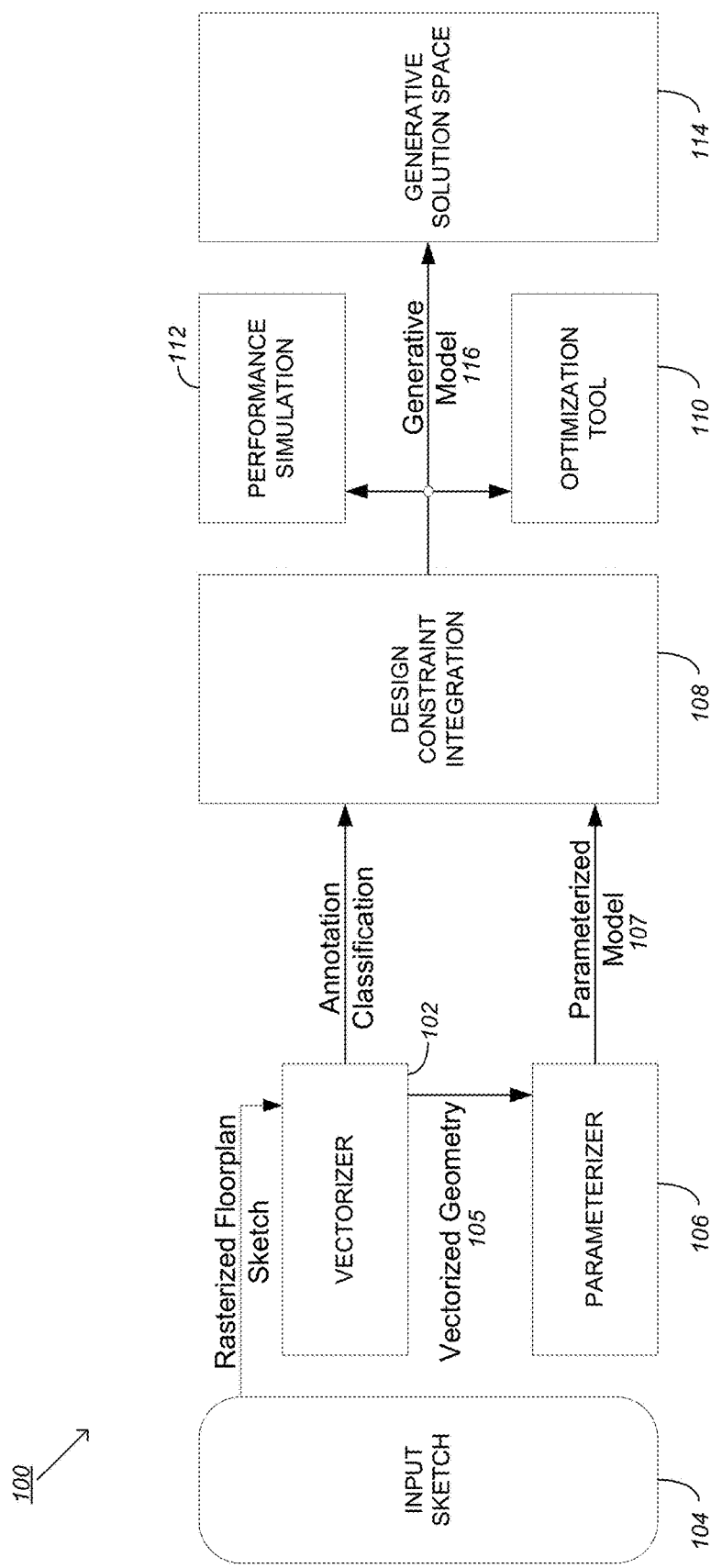
FIG. 1 illustrates the workflow of an automated parametrization method in accordance with one or more embodiments of the invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.
Workflow Design FIG. 1 illustrates the workflow of an automated parametrization method in accordance with one or more embodiments of the invention.

The system 100 consists of four primary components/steps: (i) the vectorizer module 102, where hand-drawn rasterized floorplan sketches 104 are converted to vectorized data structures; (ii) the parametrizer module 106, where various building elements are joined and constrained in relation to each other according to their vectorized geometric properties; (iii) design constraint integration module 108, where user-defined optimization constraints and variables are parsed, and where annotations in the drawing are detected and applied to the parametric model; and (iv) the NSGA-II optimization module 110 that is integrated with the other components for customized performance-based optimization tasks. The different components are described in detailed below.

Input Sketch 104

The input sketch can be a raster sketch acquired via direct input/sketching, a drawing application, and/or a scan of an existing image. In this regard, the input sketch 104 may be a drawing on a back of a napkin or any other type of raster drawing. In one or more embodiments, the input sketch 104 is a rasterized floorplan sketch (e.g., for a floorplan of an architectural, engineering, and/or construction design).

Vectorizer 102

The vectorizer module 102 reads the input sketch 104 and converts the raster based input sketch 104 into vectorized geometry 105. Any type of vectorizer may be utilized to produce the vectorized geometry 105.

In one or more embodiments, the vectorizer module 102 integrates a special form of asymmetric convolution to detect linear features present at just a few hundredths of a percent of overall luminosity and run at five (5) independent resolutions simultaneously. For each node (pixel) found to contain linearity, the resolutions participate in a weighted optimization to compute the resulting output orientation and gain. The core algorithm is parallelized to run on multi-GPU (graphics processing unit) environments as well as AVX CPU (advanced vector extensions central processing unit) instructions and can vectorize a 3 k by 3 k scene at several resolutions in a few hundred milliseconds. The vectorizer module 102 is an investigation and prototype of computer vision techniques that support extraction of vector and linear information from raster sources, including photos of plans or hand-drawn sketches. The applied use-case in one or more embodiments of the invention is for architects to create or import conceptual designs quickly, and with a minimum of errors.

Parameterizer 106

The parameterizer module 106 takes the output of vectorized geometry 105 and converts the vector geometry 105 to a parametric/parametrized model 107. The parameterizer 106 includes an algorithm that is responsible for applying geometric grammar and topological relationships to the vectorized geometrical data 105. This is achieved by considering contextual and mutual attributes of each of the vectorized segments and converting the data to a graph system. In other words, the vectorized geometry 105 is converted into a node a path data structure by considering contextual and mutual attributes of each of the vectorized segments.

Building elements such as walls, columns, etc. are automatically generated using predefined architectural assumptions and clustered based on type, position, and continuity. Moreover, all groups are constrained by their neighboring group resulting in joint variable parameters for the generated elements. As each member element is defined by a corresponding node and path, effective translations applied to one element group would also apply to the connected member of the neighboring groups. Such attributes would allow geometric translations of each group to apply in a parametric fashion, with modifications (e.g., translation) happening in a constrained range while maintaining the overall geometric layout.

Transformation is assigned to the nodes of the parametric graphs, wherein each node represents corner coordinates of the target wall elements. This transformation modifies all lines connected to the transformed node. However, to avoid distortion of the orthogonal nature of the plans, colinear paths (which connect to each other with a mutual node and share the same direction vector) are merged. Next, the array of nodes that are located on the collinear lines are identified. After applying transformations to the connected line node array, new polylines are constructed from each node array. This would result in a fully automated parametric model that takes transformation vectors and connected line indices as an input and outputs a new floorplan layout without producing undesired gaps and floorplan voids.

Various parametric functions may also be accessible using the corresponding components in a parameterizer plug-in (e.g., for a visual logic programming environment such as the DYNAMO programming environment available from AUTODESK), giving the user the ability to customize the parametrization process in a controlled setting. Grouping can be done based on different criteria (connected lines, adjacent nodes, etc.), which can also be modified by the user of the system to achieve maximum correlations with the design objectives. Furthermore, a parametric model may be reconstructed in other analysis tools, such as ROBOT structural analysis software, the RADIANCE tool suite, and/or the ENERGYPLUS building energy simulation program, allowing bi-directional data interaction between the parametric and analysis model. Such restructuring using analysis tools can result in a faster feedback and iteration process from each sketching attempt as simulated results are updated upon each save/update of the floorplan drawing.

Design Constraint Integration 108

While the floorplan elements of the parametric model 107 generated in the previous steps are constrained only by its geometric properties, the designer can additionally identify specific optimization variables to narrow the solution search to solutions with certain geometric modifications. In this regard, embodiments of the invention allow the user to specify the variable elements and their corresponding translation constraints by drawing "I" shaped annotations. The position and orientation of these annotations would allow the system to identify the specific parametric group and allocate a certain translation range based on the length of the annotation.

Moreover, the user can manually access the target variables by implementing specific components of a parameterizer plugin-in, to modify or visualize the elements (e.g., using number sliders such as those available from the DYNAMO application). This would allow additional design control over the generated parametric model by the user, offering a parallel manual workflow to the automatic procedure.

Generation and Optimization 114

Embodiments of the invention may be integrated with an optimization tool 110 (e.g., the REFINERY optimization tool or other NSGA-II optimization tool), to execute building performance optimization tasks. By defining components as input parameters, and assigning custom design goals, such as topological outcomes or performance simulations for the solver, the system 100 can search and evaluate the fitness of each generated model 116. The parametric constraints specified by sketch-based annotation are also automatically integrated in the workflow.

Experimental Results

An exemplary use case of embodiments of the invention is that of a structural optimization. Specifically, given a building floorplan sketch, embodiments of the invention find the optimized position of the annotated target walls to minimize the total stress and torsion of simulated structural system. Further, embodiments of the invention are integrated with the AUTODESK ROBOT application, a structural analysis tool. For simplicity, each analytical column may be defined by extruding the intersection points of the floorplan walls and constructing the beams on the top and bottom edge of the wall.

Figure 2:
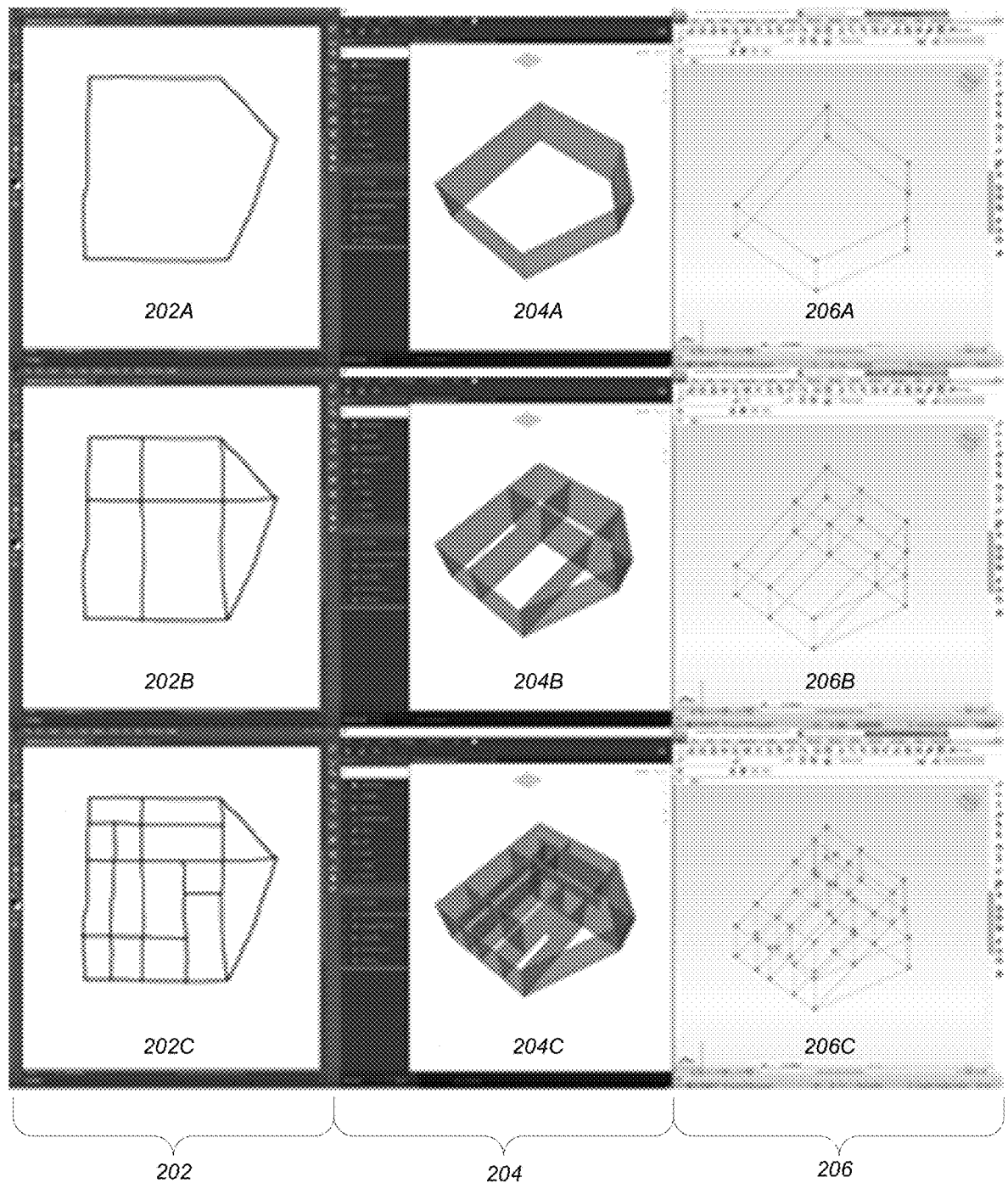
FIG. 2 illustrates multiple stages of the sketching process drawn in a sketching tool, and its automatic conversion to a parametric model in accordance with one or more embodiments of the invention.

FIG. 2 illustrates multiple stages of the sketching process drawn in a sketching tool (e.g., the ADOBE PHOTOSHOP application), and its automatic conversion to a parametric model in accordance with one or more embodiments of the invention. Column 202 illustrates different stages of the sketching process where a user is sketching a drawing starting with sketch 202A and progressing to sketch 202B, to sketch 202C. At each stage of the sketching, the user map opt to save the sketch (e.g., using keyboard controls and/or clicking a save button). Once the user saves the sketch 202, the vectorizer 102 and parameterizer 106 dynamically and autonomously generates and displays, in real time, the vectorized/parameterized model (e.g., in the DYNAMO application) represented in column 204 (i.e., models 204A, 204B, and 204C).

Due to the fast processing time of the performance metrics, embodiments of the invention can also observe real-time updates in the structural analysis model 206A, 206B, and 206C. In other words, via the design constraint integration 108, the structural analysis model 206 may be dynamically and autonomously generated and displayed, in real time (e.g., in the ROBOT application) as represented in column 206 (e.g., structural analysis models 206A, 206B, and 206C). Referring to FIG. 1, the structural analysis model is referred to as the generative model 116 and via the optimization tool 110 and performance simulation 112, the structural analysis models 206 may be displayed in the generative solution space 114 (e.g., the ROBOT application).

Figure 3:
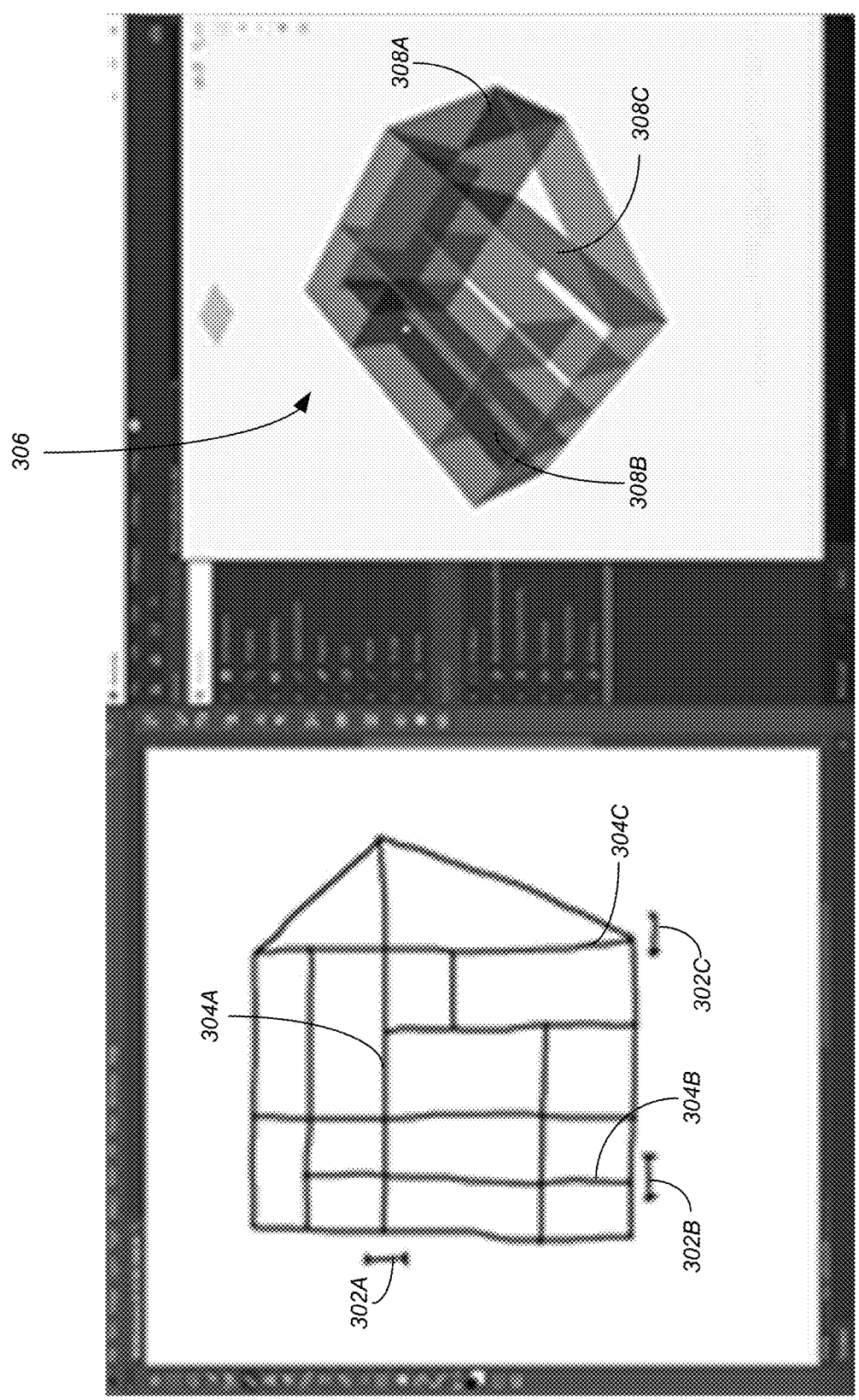
FIG. 3 illustrates the application of optimization parameters and constraints by sketching annotations in accordance with one or more embodiments of the invention.

Furthermore, the user defines three wall axes to explore how the translation of these walls can achieve the structural objective function. This process is achieved by adding simple I shaped annotations to the floorplan sketch, adjacent to the wall axes. FIG. 3 illustrates the application of optimization parameters and constraints by sketching annotations in accordance with one or more embodiments of the invention. As illustrated in FIG. 3, the user has drawn "I"s 302 (i.e., I 302A, 302B and 302C) to identify particular walls 304 (i.e., wall 304A, 304B, and 304C respectively). Based on the annotations 302, when generating the model, vectorizer 102 colors and/or differentiates the walls 304 identified by the annotations 304. The exemplary resulting model 306 generated by vectorizer 102 is illustrated with the three-dimensional walls 308 (i.e., 308A, 308B, and 308C respectively) displayed in a differentiable manner (e.g., a different color, highlighting, flashing, dashed outline, etc.).

Figure 4:
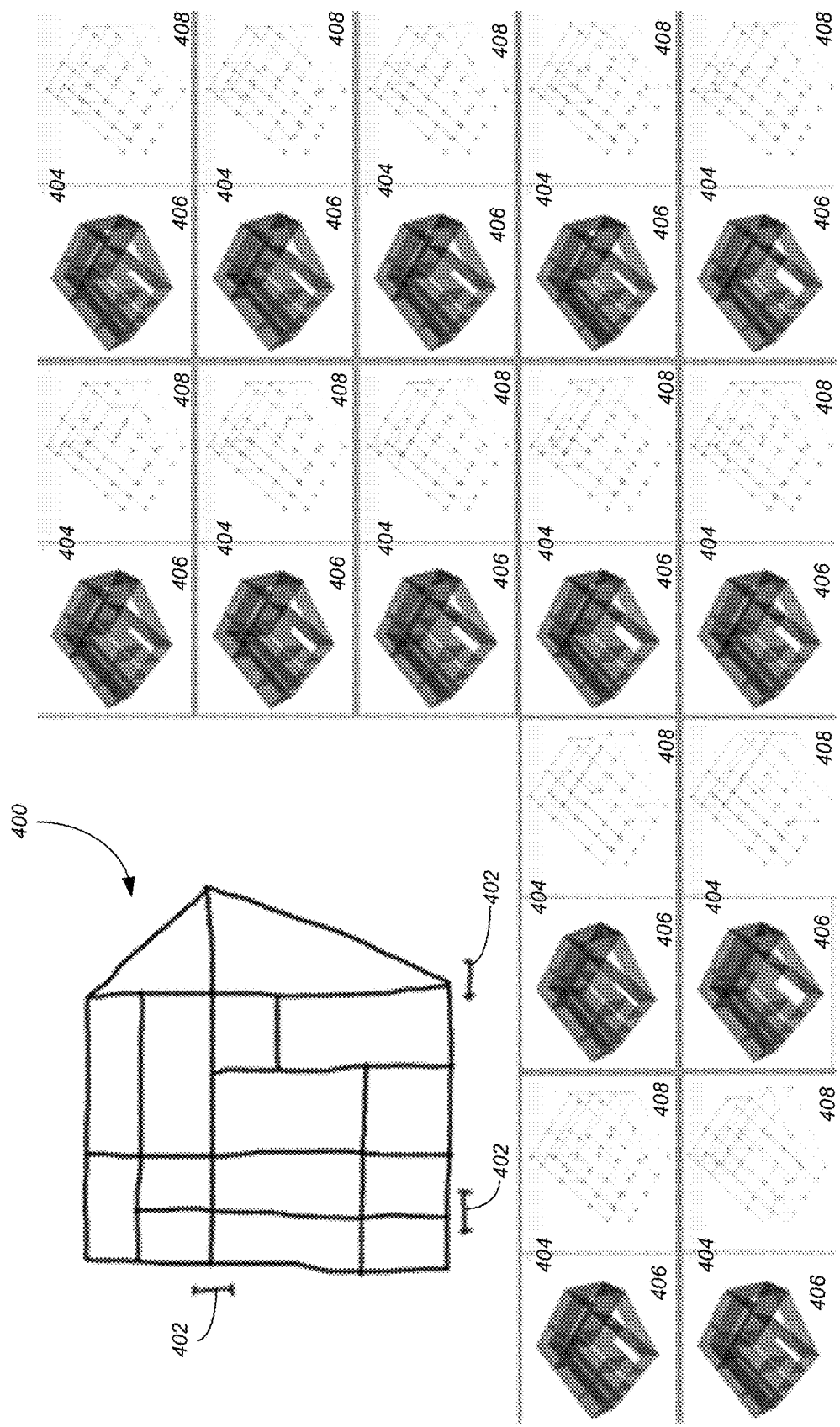
FIG. 4 illustrates different generated design solutions in accordance with one or more embodiments of the invention.

The system identifies all the corresponding intersection nodes included in the target wall 308 axes. The length of annotation 302 also defines the parametric constraints the walls 304 contain in their solution spaces. Finally, via a user interface, different optimization settings can be assigned to allow the user to control the optimization accuracy and its calculation time. This would result in the customized visualization of the optimization results (e.g., in the user interface) with the ability to explore the design solutions in real-time. In this regard, FIG. 4 illustrates different generated design solutions in accordance with one or more embodiments of the invention. The user has scanned/drawn a sketch 400 with annotations 402 and the system has generated a variety of different potential design solutions 404 (with each solution 404 including a 3D model 406 and a structural optimization 408).

Figure 5:
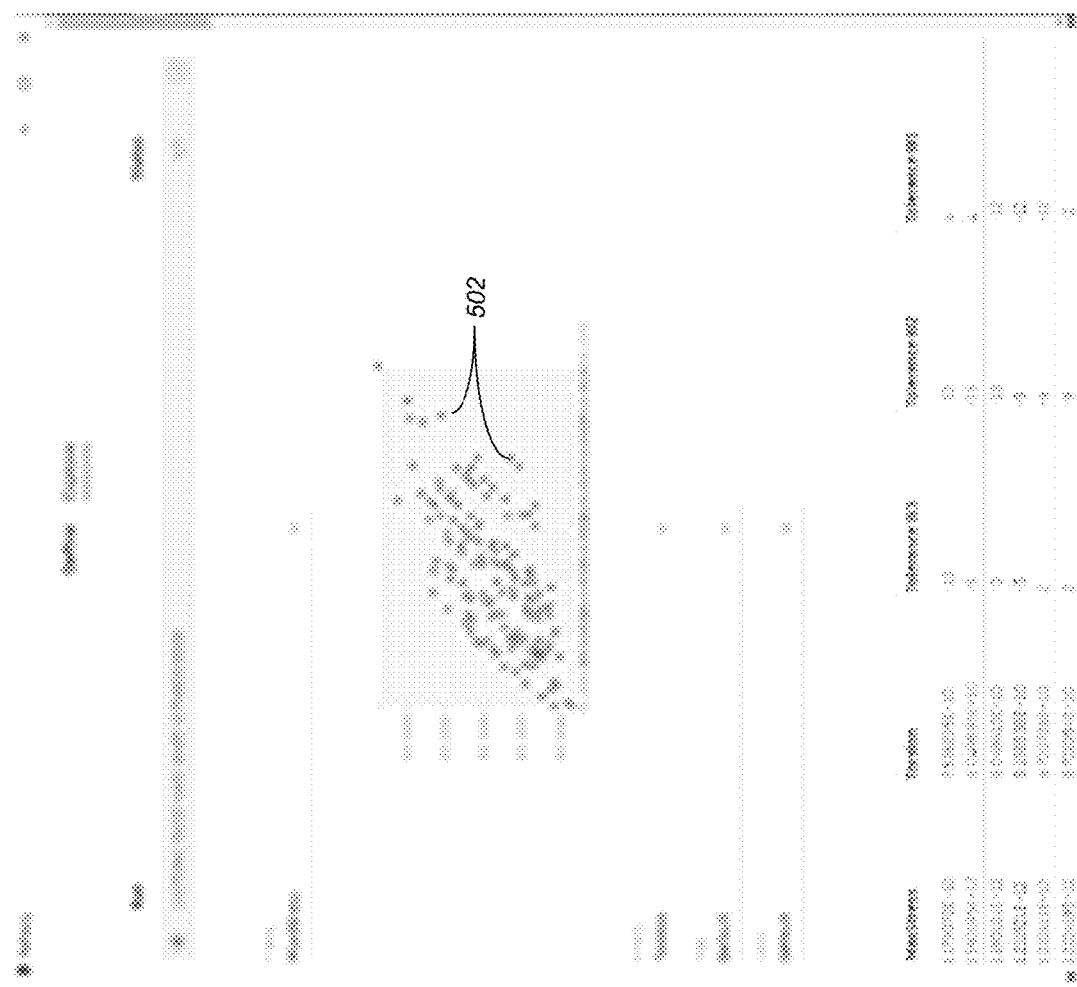
FIG. 5 illustrates the results of the optimization process via an exploration interface of a graphic design application.

FIG. 5 illustrates the results of the optimization process via an exploration interface of a graphic design application. The graphic design application may display a user interface with points 502 representing the different design solutions 404 that have been generated (e.g., each point represents a different design solution 404). By hovering on each solution point 502, a corresponding parametric model 406 (e.g., in the DYNAMO application) and structural analysis model 408 (e.g., in the ROBOT application) would update/display allowing the user-designer to investigate different properties of the generated results/models 404.

Logical Flow

Figure 6:
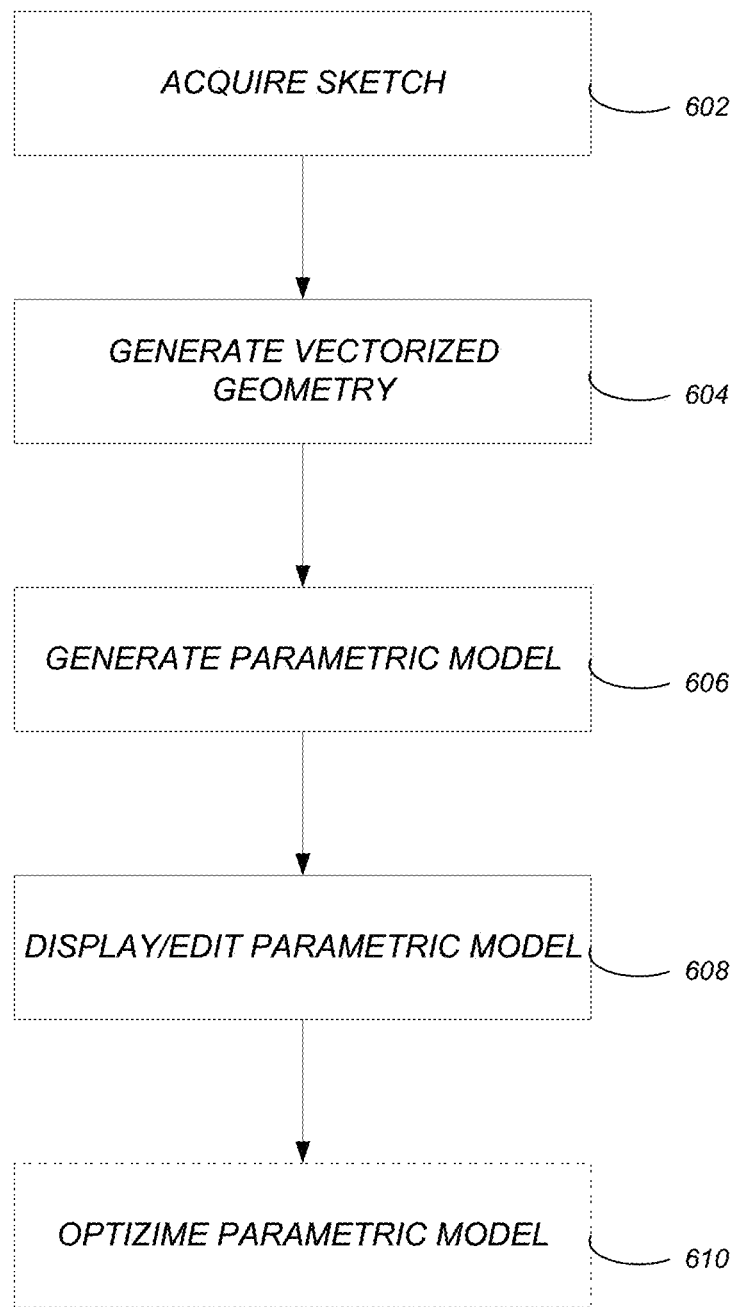
FIG. 6 illustrates the logical flow for parametrizing sketches in accordance with one or more embodiments of the invention.

FIG. 6 illustrates the logical flow for parametrizing sketches in accordance with one or more embodiments of the invention.

At step 602, a sketch is acquired. The sketch includes one or more raster lines that define a raster image based floor-plan sketch. The sketch may be acquired via input into a drawing application or may be a scanned image.

At step 604, vectorized geometry is generated from the sketch. The vectorized geometry is generated dynamically in real time based on the one or more raster lines. In addition, machine learning may be utilized to generate the vectorized geometry.

At step 606, a parametric model that is optimizable is generated from the vectorized geometry. The parametric model is generated dynamically in real time. Further, the one or more raster lines are represented in the parametric model as one or more three-dimensional walls.

At step 608, the parametric model is displayed and edited. In this regard, upon editing a parameter of the one or more three-dimensional walls of the parametric model, other parameters in the parametric model are autonomously updated. As used herein, autonomously means independent, automatic, and without a need for human control or intervention.

The edits to the parametric model may be conducted by editing the sketch. In this regard, edits to the sketch may be accepted via a user interface. Once the sketch is saved (i.e., with the accepted edits), the parametric model is autonomously updated and displayed in real time based on the edited sketch. In other words, the user does not need to edit the parametric model but merely edits the sketch and the parametric model is updated accordingly.

While embodiments of the invention require that the parametric model is optimizable, some embodiments of the invention include the additional step 610 of actually performing the optimization. In this regard, the parametric model may include one or more optimization parameters (e.g., selected from a group consisting of one or more objectives, one or more variables, and one or more constraints). IN various embodiments, steps 604 and 606 may include detecting an annotation in the drawing, and then parsing the annotation to identify a specific one of the one or more parameters and a corresponding translation constraint. Thereafter, the annotation can be applied to the parametric model by applying the specific optimization parameter and the corresponding translation constraint to the parametric model. For example, the applying the annotation (e.g., an "I") may identify one of the three-dimensional walls corresponding to the annotation as being subject to a translation range for use during optimization. Such an optimization 610 may execute building performance optimization tasks (e.g., determining a translation of the identified one of the three-dimensional walls that minimizes material use for construction based on the parametric model). In view of the above, in one or more embodiments, the annotation may consist of the "I" adjacent to a raster line representing a wall and the application of the annotation identifies that wall as being movable during an optimization operation (e.g., to minimize material use or other construction optimization procedure).

Advantages and Results

In view of the above, one may note that the process of designing and building is traditionally a linear manual time-consuming process. However, embodiments of the invention provide an efficient automated workflow that overcomes the problems of the prior art. In this regard, a high level description such as a sketch/drawing often doesn't make sense to a graphic design application. Embodiments of the invention may utilize a reasoner to deal with this lack of understanding by translating the high level description to a detailed plan.

Figure 7:
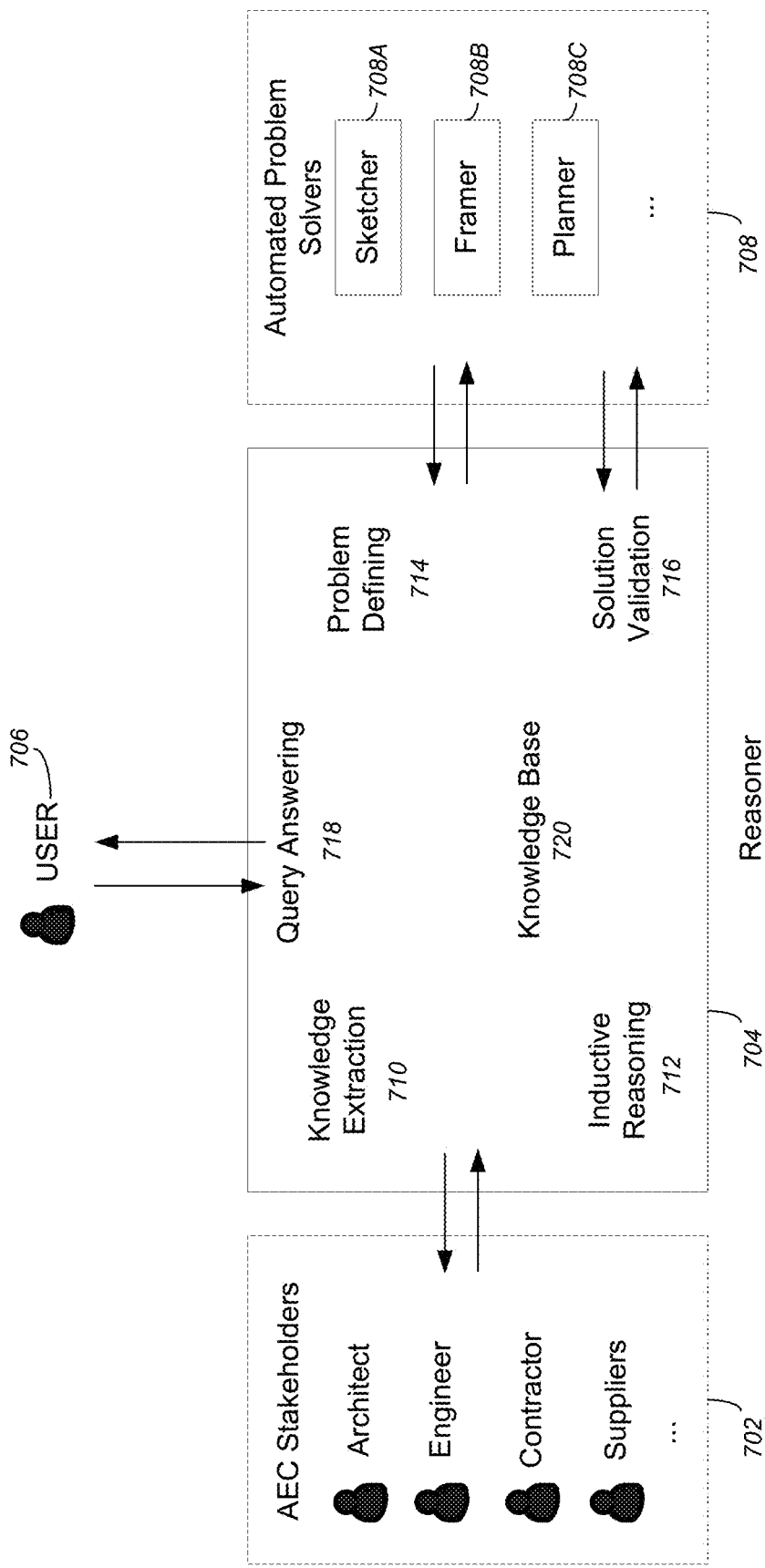
FIG. 7 illustrates the functionality performed by a reasoner in accordance with one or more embodiments of the invention.

FIG. 7 illustrates the functionality performed by a reasoner (e.g., that may be part of the vectorizer 102/parameterizer 106) in accordance with one or more embodiments of the invention. Architectural, engineering, and construction stakeholders 702 (e.g., architects, engineers, contractors, suppliers, etc.) provide/receive input/output to/from reasoner 704. The user 706 (e.g., a project team) also receives/provides input/output to/from the reasoner 704 (e.g., a query/query response). The reasoner 704 takes in very simple, broadly described set of input (e.g., from the stakeholders 702/user 706) and performs three steps that are depicted in the drawing within the automated problem solvers 708: the sketcher 708A (creates a very basic raster sketch), the framer 708B (generates a frame/outline), and the planner 708C (generates a more detailed description—e.g., a parametric model). The sketcher 708A may utilize artificial intelligence to get meaningful information from sketches in real time. In this regard, the reasoner 704 may include knowledge one or more of the following components: extraction 710, inductive reasoning 712, problem defining 714, solution validation 716, and query answering 718, based on a knowledge base 720.

Hardware and Software Environment

Figure 8:
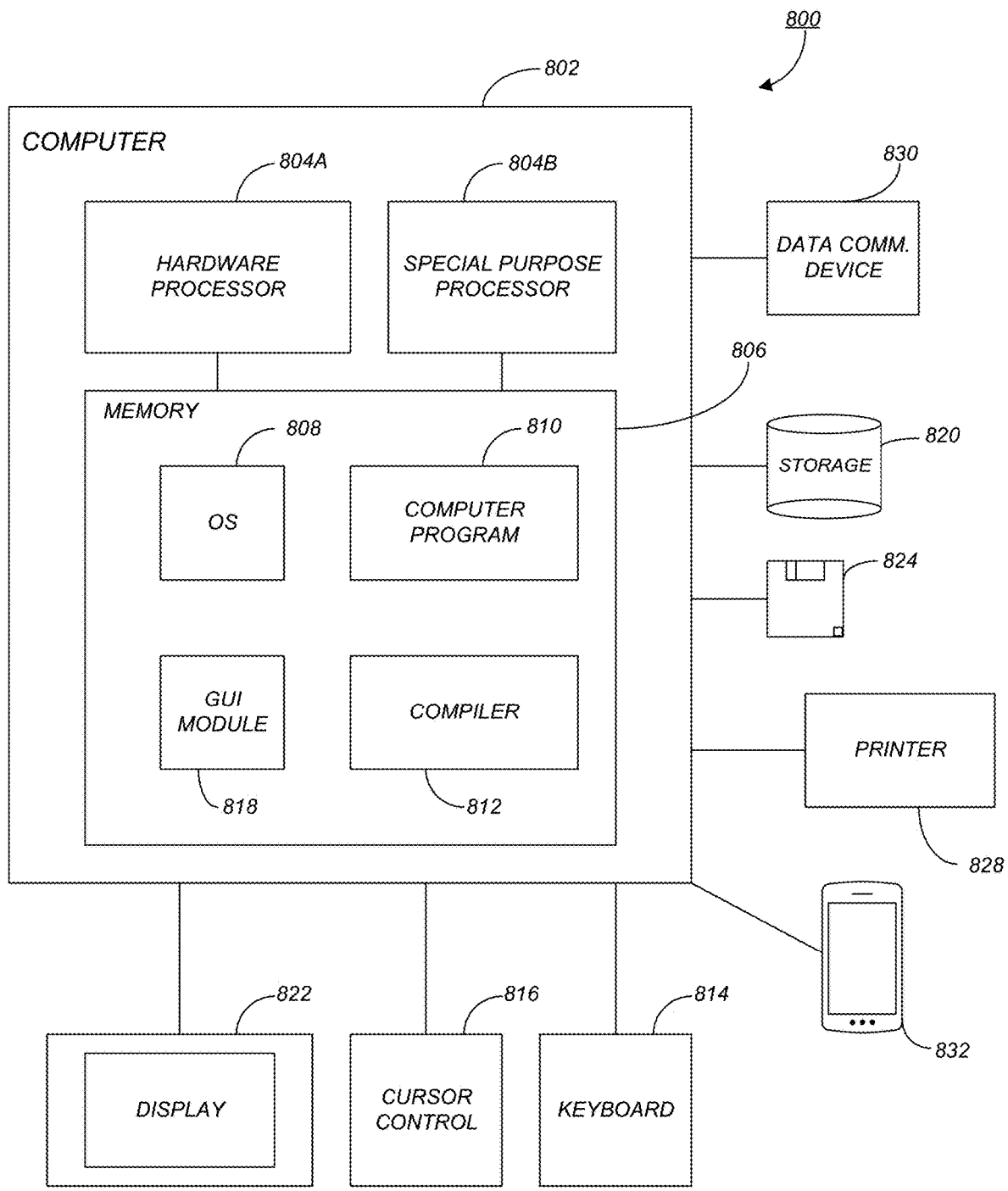
FIG. 8 is an exemplary hardware and software environment used to implement one or more embodiments of the invention.

FIG. 8 is an exemplary hardware and software environment 800 (referred to as a computer-implemented system and/or computer-implemented method) used to implement one or more embodiments of the invention. The hardware and software environment includes a computer 802 and may include peripherals. Computer 802 may be a user/client computer, server computer, or may be a database computer. The computer 802 comprises a hardware processor 804A and/or a special purpose hardware processor 804B (hereinafter alternatively collectively referred to as processor 804) and a memory 806, such as random access memory (RAM). The computer 802 may be coupled to, and/or integrated with, other devices, including input/output (I/O) devices such as a keyboard 814, a cursor control device 816 (e.g., a mouse, a pointing device, pen and tablet, touch screen, multi-touch device, etc.) and a printer 828. In one or more embodiments, computer 802 may be coupled to, or may comprise, a portable or media viewing/listening device 832 (e.g., an MP3 player, IPOD, NOOK, portable digital video player, cellular device, personal digital assistant, etc.). In yet another embodiment, the computer 802 may comprise a multi-touch device, mobile phone, gaming system, internet enabled television, television set top box, or other internet enabled device executing on various platforms and operating systems.

In one embodiment, the computer 802 operates by the hardware processor 804A performing instructions defined by the computer program 810 (e.g., a computer-aided design [CAD] application) under control of an operating system 808. The computer program 810 and/or the operating system 808 may be stored in the memory 806 and may interface with the user and/or other devices to accept input and commands and, based on such input and commands and the instructions defined by the computer program 810 and operating system 808, to provide output and results.

Output/results may be presented on the display 822 or provided to another device for presentation or further processing or action. In one embodiment, the display 822 comprises a liquid crystal display (LCD) having a plurality of separately addressable liquid crystals. Alternatively, the display 822 may comprise a light emitting diode (LED) display having clusters of red, green and blue diodes driven together to form full-color pixels. Each liquid crystal or pixel of the display 822 changes to an opaque or translucent state to form a part of the image on the display in response to the data or information generated by the processor 804 from the application of the instructions of the computer program 810 and/or operating system 808 to the input and commands. The image may be provided through a graphical user interface (GUI) module 818. Although the GUI module 818 is depicted as a separate module, the instructions performing the GUI functions can be resident or distributed in the operating system 808, the computer program 810, or implemented with special purpose memory and processors.

In one or more embodiments, the display 822 is integrated with/into the computer 802 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 802 according to the computer program 810 instructions may be implemented in a special purpose processor 804B. In this embodiment, some or all of the computer program 810 instructions may be implemented via firmware instructions stored in a read only memory (ROM), a programmable read only memory (PROM) or flash memory within the special purpose processor 804B or in memory 806. The special purpose processor 804B may also be hardwired through circuit design to perform some or all of the operations to implement the present invention. Further, the special purpose processor 804B may be a hybrid processor, which includes dedicated circuitry for performing a subset of functions, and other circuits for performing more general functions such as responding to computer program 810 instructions. In one embodiment, the special purpose processor 804B is an application specific integrated circuit (ASIC).

The computer 802 may also implement a compiler 812 that allows an application or computer program 810 written in a programming language such as C, C++, Assembly, SQL, PYTHON, PROLOG, MATLAB, RUBY, RAILS, HASKELL, or other language to be translated into processor 804 readable code. Alternatively, the compiler 812 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 810 accesses and manipulates data accepted from I/O devices and stored in the memory 806 of the computer 802 using the relationships and logic that were generated using the compiler 812.

The computer 802 also optionally comprises an external communication device such as a modem, satellite link, Ethernet card, or other device for accepting input from, and providing output to, other computers 802.

In one embodiment, instructions implementing the operating system 808, the computer program 810, and the compiler 812 are tangibly embodied in a non-transitory computer-readable medium, e.g., data storage device 820, which could include one or more fixed or removable data storage devices, such as a zip drive, floppy disc drive 824, hard drive, CD-ROM drive, tape drive, etc. Further, the operating system 808 and the computer program 810 are comprised of computer program 810 instructions which, when accessed, read and executed by the computer 802, cause the computer 802 to perform the steps necessary to implement and/or use the present invention or to load the program of instructions into a memory 806, thus creating a special purpose data structure causing the computer 802 to operate as a specially programmed computer executing the method steps described herein. Computer program 810 and/or operating instructions may also be tangibly embodied in memory 806 and/or data communications devices 830, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 802.

Figure 9:
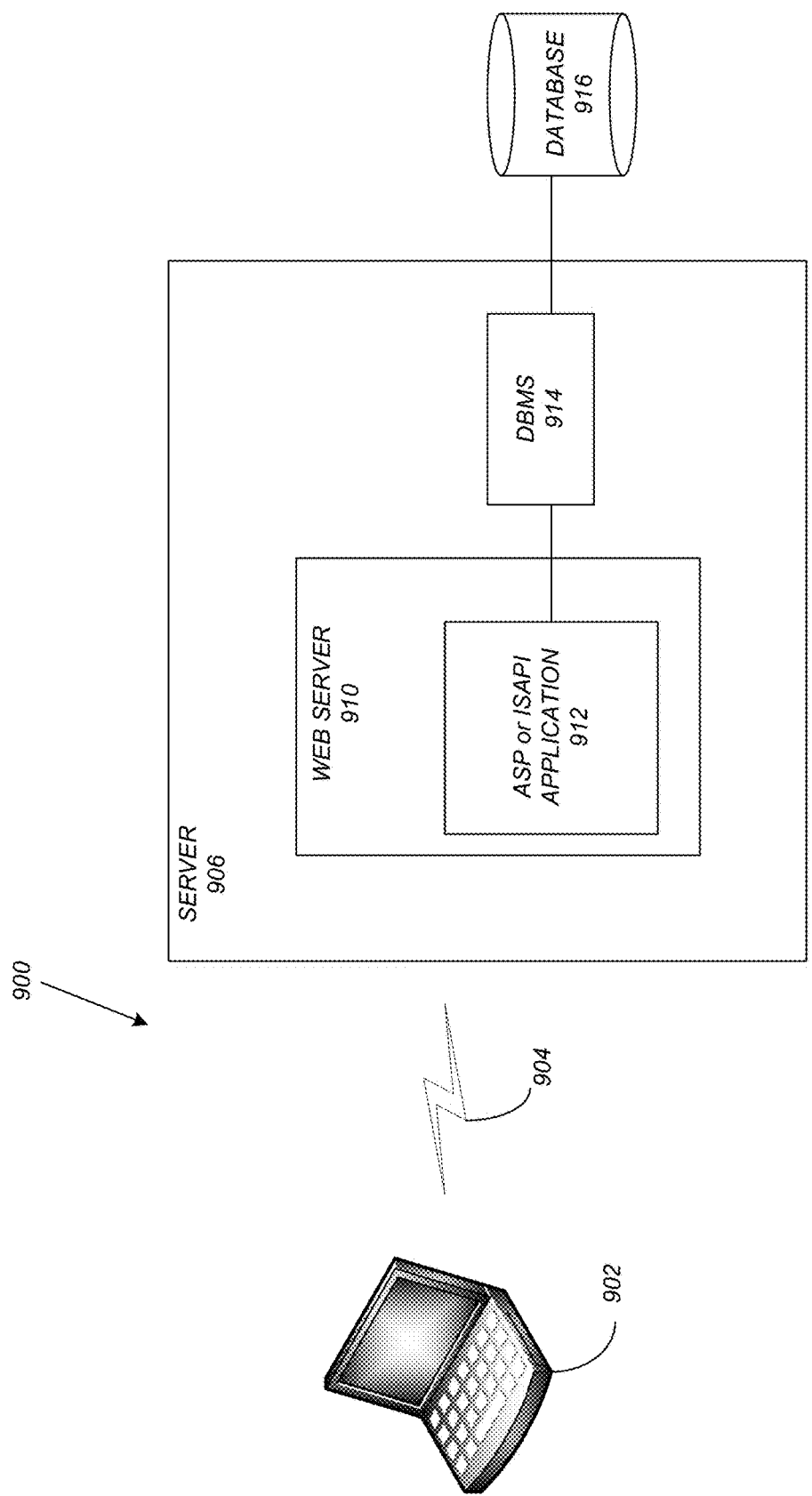
FIG. 9 schematically illustrates a typical distributed/cloud-based computer system using a network to connect client computers to server computers in accordance with one or more embodiments of the invention.

FIG. 9 schematically illustrates a typical distributed/cloud-based computer system 900 using a network 904 to connect client computers 902 to server computers 906. A typical combination of resources may include a network 904 comprising the Internet, LANs (local area networks), WANs (wide area networks), SNA (systems network architecture) networks, or the like, clients 902 that are personal computers or workstations (as set forth in FIG. 8), and servers 906 that are personal computers, workstations, minicomputers, or mainframes (as set forth in FIG. 8). However, it may be noted that different networks such as a cellular network (e.g., GSM [global system for mobile communications] or otherwise), a satellite based network, or any other type of network may be used to connect clients 902 and servers 906 in accordance with embodiments of the invention.

A network 904 such as the Internet connects clients 902 to server computers 906. Network 904 may utilize ethernet, coaxial cable, wireless communications, radio frequency (RF), etc. to connect and provide the communication between clients 902 and servers 906. Further, in a cloud-based computing system, resources (e.g., storage, processors, applications, memory, infrastructure, etc.) in clients 902 and server computers 906 may be shared by clients 902, server computers 906, and users across one or more networks. Resources may be shared by multiple users and can be dynamically reallocated per demand. In this regard, cloud computing may be referred to as a model for enabling access to a shared pool of configurable computing resources.

Clients 902 may execute a client application or web browser and communicate with server computers 906 executing web servers 910. Such a web browser is typically a program such as MICROSOFT INTERNET EXPLORER/ EDGE, MOZILLA FIREFOX, OPERA, APPLE SAFARI, GOOGLE CHROME, etc. Further, the software executing on clients 902 may be downloaded from server computer 906 to client computers 902 and installed as a plug-in or ACTIVEX control of a web browser. Accordingly, clients 902 may utilize ACTIVEX components/component object model (COM) or distributed COM (DCOM) components to provide a user interface on a display of client 902. The web server 910 is typically a program such as MICROSOFT'S INTERNET INFORMATION SERVER.

Web server 910 may host an Active Server Page (ASP) or Internet Server Application Programming Interface (ISAPI) application 912, which may be executing scripts. The scripts invoke objects that execute business logic (referred to as business objects). The business objects then manipulate data in database 916 through a database management system (DBMS) 914. Alternatively, database 916 may be part of, or connected directly to, client 902 instead of communicating/ obtaining the information from database 916 across network 904. When a developer encapsulates the business functionality into objects, the system may be referred to as a component object model (COM) system. Accordingly, the scripts executing on web server 910 (and/or application 912) invoke COM objects that implement the business logic. Further, server 906 may utilize MICROSOFT'S TRANSACTION SERVER (MTS) to access required data stored in database 916 via an interface such as ADO (Active Data Objects), OLE DB (Object Linking and Embedding DataBase), or ODBC (Open DataBase Connectivity).

Generally, these components 900-916 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 902 and 906 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 902 and 906. Embodiments of the invention are implemented as a software/CAD application on a client 902 or server computer 906. Further, as described above, the client 902 or server computer 906 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide a sketch-based generative design system for building performance optimization tasks. Targeted for amateur users, embodiments of the invention can be applied in the early stages of the design process, to facilitate architects and designers with limited programming experience in performance-based decision making. Embodiments of the invention assist in form-finding and layout planning in a fast and iterative process. Additional embodiments may include generating optimized multi-level floorplans and 3D building volumes using conceptual sketches of the building, and semantic recognition of furniture layout sketches. Moreover, embodiments of the invention may also include an integration with a structural surrogate model for faster processing and solution generation procedures.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[Asadi 2015] Asadi, Somayeh, and Zong Woo Geem. 2015. "Sustainable Building Design: A Review on Recent Metaheuristic Methods." In, 203-23. Springer, Cham. https://doi.org/10.1007/978-3-319-13826-8_11.

[Attia 2013] Attia, Shady, Mohamed Hamdy, William O'Brien, and Salvatore Carlucci. 2013. "Assessing Gaps and Needs for Integrating Building Performance Optimization Tools in Net Zero Energy Buildings Design." *Energy and Buildings* 60: 110-24. https://doi.org/10.1016/j.enbuild.2013.01.016.

[Basbagill 2014] Basbagill, John P., Forest L. Flager, and Michael Lepech. 2014. "A Multi-Objective Feedback Approach for Evaluating Sequential Conceptual Building Design Decisions." *Automation in Construction* 45: 136-50. https://doi.org/10.1016/j.autcon.2014.04.015.

[Brown 2016] Brown, Nathan C., and Caitlin T. Mueller. 2016. "Design for Structural and Energy Performance of Long Span Buildings Using Geometric Multi-Objective Optimization." *Energy and Buildings* 127 (September). Elsevier: 748-61. https://doi.org/10.1016/J.ENBUILD.2016.05.090.

[Eitz, Hays, and Alexa 2012] Eitz, Mathias, James Hays, and Marc Alexa. 2012. "How Do Humans Sketch Objects?" *ACM Transactions on Graphics* 31 (4). ACM: 1-10. https://doi.org/10.1145/2185520.2185540.

[Eitz, Richter et al. 2012] Eitz, Mathias, Ronald Richter, Tamy Boubekeur, Kristian Hildebrand, and Marc Alexa. 2012. "Sketch-Based Shape Retrieval." *ACM Transactions on Graphics* 31 (4). ACM: 1-10. https://doi.org/10.1145/2185520.2185527.

[Funkhouser 2003] Funkhouser, Thomas, Patrick Min, Michael Kazhdan, Joyce Chen, Alex Halderman, David Dobkin, and David Jacobs. 2003. "A Search Engine for 3D Models." *ACM Transactions on Graphics* 22 (1). ACM: 83-105. https://doi.org/10.1145/588272.588279.

[Hou 2006] Hou, Suyu, and Karthik Ramani. 2006. "Sketch-Based 3D Engineering Part Class Browsing and Retrieval." *Proceedings of the EUROGRAPHICS Workshop on Sketch-Based Interfaces and Modeling.* Eurographics Association, 131-38. https://doi.org/10.2312/SBM/SBM06/131-138.

[Huang 2016] Huang, Yu, and Jian-lei Niu. 2016. "Optimal Building Envelope Design Based on Simulated Performance: History, Current Status and New Potentials." *Energy and Buildings* 117 (April). Elsevier: 387-98. https://doi.org/10.1016/J.ENBUILD.2015.09.025.

[Krizhevsky 2017] Krizhevsky, Alex, Ilya Sutskever, and Geoffrey E. Hinton. 2017. "ImageNet Classification with Deep Convolutional Neural Networks." *Communications of the ACM* 60 (6). ACM: 84-90. https://doi.org/10.1145/3065386.

[Lin 2014] Lin, Shih-Hsin Eve, and David Jason Gerber. 2014. "Designing-in Performance: A Framework for Evolutionary Energy Performance Feedback in Early Stage Design." *Automation in Construction* 38 (March). Elsevier: 59-73. https://doi.org/10.1016/J.AUTCON.2013.10.007.

[Nishida 2016] Nishida, Gen, Ignacio Garcia-Dorado, Daniel G Aliaga, Bedrich Benes, and Adrien Bousseau. 2016. "Interactive Sketching of Urban Procedural Models." *ACM Transactions on Graphics* 35 (4): 1-11. https://doi.org/10.1145/2897824.2925951.

[Schneider 2014] Schneider, Rosália G., and Tinne Tuytelaars. 2014. "Sketch Classification and Classification-Driven Analysis Using Fisher Vectors." *ACM Transactions on Graphics* 33 (6): 1-9. https://doi.org/10.1145/2661229.2661231.

[Su 2015] Su, Hang, Subhransu Maji, Evangelos Kalogerakis, and Erik Learned-Miller. 2015. "Multi-View Convolutional Neural Networks for 3D Shape Recognition." *Proceedings of the IEEE International Conference on Computer Vision* 2015 Inter. IEEE: 945-53. https://doi.org/10.1109/ICCV.2015.114.

[Nguyen 2014] Nguyen, A. T., Reiter, S. and Rigo, P., 2014. A review on simulation-based optimization methods applied to building performance analysis. Applied Energy, 113, pp. 1043-1058.

[Turrin 2011] Turrin, Michela, Peter Von Buelow, and Rudi Stouffs. 2011. "Design Explorations of Performance Driven Geometry in Architectural Design Using Parametric Modeling and Genetic Algorithms." *Advanced Engineering Informatics* 25 (4): 656-75. https://doi.org/10.1016/j.aei.2011.07.009.

[Wang 2015] Wang, Fang, Le Kang, and Yi Li. 2015. "Sketch-Based 3D Shape Retrieval Using Convolutional Neural Networks." https://www.cv-foundation.org/openaccess/content_cvpr_2015/html/Wang_Sketch-Based_3D_Shape_2015_CVPR_paper.html.

What is claimed is:

1. A computer-implemented method for parametrizing a sketch, comprising:
   (a) acquiring a sketch, wherein the sketch comprises one or more raster lines that define a raster image based floor-plan sketch;
   (b) generating, from the sketch, vectorized geometry, wherein the vectorized geometry is generated dynamically in real time based on the one or more raster lines;
   (c) generating, from the vectorized geometry, a parametric model that is optimizable, wherein:
      (i) the parametric model is generated dynamically in real time,
      (ii) the one or more raster lines are represented in the parametric model as one or more three-dimensional walls;
      (iii) the parametric model comprises building elements defined by a corresponding node and path data structure that considers contextual and mutual attributes of each segment of the vectorized geometry;
      (iv) within the parametric model, building elements are clustered into one or more groups; and
      (v) the one or more groups are constrained by neighboring groups, and geometric modifications to one element group applies to connected members of neighboring groups; and
   (d) displaying and editing the parametric model, wherein upon editing a parameter of the one or more three-dimensional walls of the parametric model, other parameters in the parametric model are autonomously updated.

2. The computer-implemented method of claim 1, wherein the sketch is acquired via input into a drawing application.

3. The computer-implemented method of claim 1, further comprising:
   accepting edits via a user interface, to the sketch;
   saving the sketch with the accepted edits; and
   upon saving the edited sketch, autonomously updating and displaying the parametric model in real time based on the edited sketch.

4. The computer-implemented method of claim 1, wherein the parametric model comprises one or more optimization parameters.

5. The computer-implemented method of claim 4, wherein the one or more optimization parameters are selected from a group consisting of one or more objectives, one or more variables, and one or more constraints.

6. The computer-implemented method of claim 4, wherein the generating the vectorized geometry and generating the parametric model further comprise:
   detecting an annotation in the sketch;
   parsing the annotation to identify a specific one of the one or more parameters and a corresponding translation constraint; and
   applying the annotation to the parametric model by applying the specific one of the one or more optimization parameters and the corresponding translation constraint to the parametric model.

7. The computer-implemented method of claim 6, wherein:
   the applying the annotation further comprises identifying one of the three-dimensional walls corresponding to the annotation as being subject to a translation range for use during optimization; and
   the method further comprises optimizing the parametric model.

8. The computer-implemented method of claim 7, wherein:
   the optimizing the parametric model comprises determining a translation of the identified one of the three-dimensional walls that minimizes material use for construction based on the parametric model.

9. The computer-implemented method of claim 7, wherein:
   the optimizing the parametric model executes building performance optimization tasks.

10. A computer-implemented system for parametrizing a sketch, comprising:
    (a) a computer having a memory;

(b) a processor executing on the computer;
(c) the memory storing a set of instructions, wherein the set of instructions, when executed by the processor cause the processor to perform operations comprising:
  (i) acquiring a sketch, wherein the sketch comprises one or more raster lines that define a raster image based floor-plan sketch;
  (ii) generating, from the sketch, vectorized geometry, wherein the vectorized geometry is generated dynamically in real time based on the one or more raster lines;
  (iii) generating, from the vectorized geometry, a parametric model that is optimizable, wherein:
    (A) the parametric model is generated dynamically in real time;
    (B) the one or more raster lines are represented in the parametric model as one or more three-dimensional walls;
    (C) the parametric model comprises building elements defined by a corresponding node and path data structure that considers contextual and mutual attributes of each segment of the vectorized geometry;
    (D) within the parametric model, building elements are clustered into one or more groups; and
    (E) the one or more groups are constrained by neighboring groups, and geometric modifications to one element group applies to connected members of neighboring groups; and
  (iv) displaying and editing the parametric model, wherein upon editing a parameter of the one or more three-dimensional walls of the parametric model, other parameters in the parametric model are autonomously updated.

11. The computer-implemented system of claim 10, wherein the sketch is acquired via input into a drawing application.

12. The computer-implemented system of claim 10, wherein the operations further comprise:
  accepting edits via a user interface, to the sketch;
  saving the sketch with the accepted edits; and
  upon saving the edited sketch, autonomously updating and displaying the parametric model in real time based on the edited sketch.

13. The computer-implemented system of claim 10, wherein the parametric model comprises one or more optimization parameters.

14. The computer-implemented system of claim 13, wherein the one or more optimization parameters are selected from a group consisting of one or more objectives, one or more variables, and one or more constraints.

15. The computer-implemented system of claim 13, wherein the generating the vectorized geometry and generating the parametric model further comprise:
  detecting an annotation in the sketch;
  parsing the annotation to identify a specific one of the one or more parameters and a corresponding translation constraint; and
  applying the annotation to the parametric model by applying the specific one of the one or more optimization parameters and the corresponding translation constraint to the parametric model.

16. The computer-implemented system of claim 15, wherein:
  the applying the annotation further comprises identifying one of the three-dimensional walls corresponding to the annotation as being subject to a translation range for use during optimization; and
  the method further comprises optimizing the parametric model.

17. The computer-implemented system of claim 16, wherein:
  the optimizing the parametric model comprises determining a translation of the identified one of the three-dimensional walls that minimizes material use for construction based on the parametric model.

18. The computer-implemented system of claim 16, wherein:
  the optimizing the parametric model executes building performance optimization tasks.

* * * * *